United States Patent [19]
Kepler et al.

[11] Patent Number: 5,970,363
[45] Date of Patent: Oct. 19, 1999

[54] SHALLOW TRENCH ISOLATION FORMATION WITH IMPROVED TRENCH EDGE OXIDE

[75] Inventors: Nick Kepler, Saratoga; Olov Karlsson; Larry Wang, both of San Jose, all of Calif.; Basab Bandyopadhyay, Austin, Tex.; Effiong Ibok, Sunnyvale; Christopher F. Lyons, Fremont, both of Calif.

[73] Assignee: Advanced Micro Devices, Inc., Sunnyvale, Calif.

[21] Appl. No.: 08/993,827

[22] Filed: Dec. 18, 1997

[51] Int. Cl.⁶ .............................................. H01L 21/8242
[52] U.S. Cl. ............................................ 438/435; 438/296
[58] Field of Search .................................. 438/424–437, 438/444, 296, 386–392

[56] References Cited

U.S. PATENT DOCUMENTS

| | | | |
|---|---|---|---|
| 4,952,524 | 8/1990 | Lee et al. | 438/437 |
| 5,087,586 | 2/1992 | Chan et al. | 438/429 |
| 5,234,845 | 8/1993 | Aoki et al. | 438/444 |
| 5,236,863 | 8/1993 | Iranmanesh | 438/429 |
| 5,264,395 | 11/1993 | Bindal et al. | 438/435 |
| 5,472,904 | 12/1995 | Figura et al. | 438/426 |

*Primary Examiner*—Olik Chaudhuri
*Assistant Examiner*—Anh D. Mai

[57] ABSTRACT

A shallow trench isolation structure is formed which enables the growth of a high quality gate oxide at the trench edges. Embodiments include forming a photoresist mask directly on a pad oxide layer which, in turn, is formed on a main surface of a semiconductor substrate or an epitaxial layer on a semiconductor substrate. After masking, the substrate is etched to form a trench, an oxide liner is grown in the trench surface, and a polish stop layer is deposited over the oxide liner and the pad oxide layer. The polish stop layer is then masked to the trench edges, and the polish stop in the trench etched away. The trench is then filled with an insulating material, the insulating material is planarized, and the polish stop is removed by etching. Thus, the oxide liner is allowed to grow on the trench edges without the restraint of a polish stop, resulting in a thick, rounded oxide on the trench edges. Additionally, no polish stop layer remains in the trench to cause unwanted electrical effects.

30 Claims, 6 Drawing Sheets

500

SHALLOW TRENCH ISOLATION FORMATION WITH IMPROVED TRENCH EDGE OXIDE

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate, typically monocrystalline silicon or an epitaxial layer formed thereon, bounding the active regions.

One type of isolation structure is known as trench isolation, wherein shallow trenches are etched in the substrate and a thin oxide liner is thermally grown on the trench walls. The trench is then refilled with a thick insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor. The quality and thickness of the gate oxide are crucial to the performance of the finished device.

A typical method of trench formation comprises initially growing a pad oxide layer on the substrate, and depositing a nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality and to round the trench corner. The trench is then refilled with an insulating material (or "trench fill"), such as silicon dioxide derived from tetraethyl orthosilicate (TEOS). The surface is then planarized, as by chemical-mechanical polishing (CMP) using the nitride layer as a polish stop. In subsequent operations, the nitride and pad oxide are stripped off, and a gate oxide layer is grown on the exposed silicon of the substrate.

Disadvantageously, the gate oxide layer typically does not grow uniformly. Rather, it tends to be thinner at the trench edges, because the gate oxide growth rate is smaller there due to the sharpness of the trench edges and the different crystallographic orientation of the silicon at the trench edges. The thinness of the gate oxide and the sharpness of the trench edges increase the electric field strength at the trench edges, thereby decreasing device reliability.

In copending application Ser. No. 08/993,858, a method is disclosed for forming trench isolation wherein an oxide layer at the trench corners is thick and rounded. The disclosed methodology comprises growing a pad oxide layer on the substrate, then applying a photoresist mask directly on the pad oxide layer to define the trench areas. The exposed portions of the pad oxide layer are etched away, and the etching continues into the substrate to form the shallow trench. When etching of the trench is completed, the photoresist is stripped off the pad oxide layer, and the substrate is oxidized to form an oxide liner on the walls, base and top edges of the trench. A polish stop such as a nitride is then applied over the pad oxide and oxide liner. Next, the trench is refilled with an insulating material, and planarized down to the nitride polish stop. FIG. 1 illustrates an STI structure formed by this methodology and comprising substrate 100, pad oxide layer 102, trench 104 with trench edge 104a, liner oxide 106, polish stop 108, and insulating material 110. Since the liner oxide 106 is formed directly on the trench edge 104a without the restraint of a nitride polish stop, it grows thick and rounded, and upon removal of the nitride polish stop 108 over the active area 100a by anisotropic etching, remains over the trench edge 104a, thereby contributing to the improvement of the quality of the subsequently grown gate oxide.

The methodology disclosed in copending Application Serial No. 08/993,858 contributes to solving the problems of thin gate oxide at the trench edges and sharpness of the trench edges, thereby reducing the electric field between the gate electrode and substrate in proximity to the trench edges and improving gate oxide quality. However, as a result of this methodology, the nitride polish stop 108 remains in the trench 104 upon completion of the STI structure. The presence of the nitride polish stop 108 in the trench 104 is potentially disadvantageous due to the high dielectric properties of the nitride polish stop 108, which can cause unwanted electrical effects, such as low field threshold voltages at the bottom of the trench 104 and transistor edge leakage at the trench edge 104a.

There exists a continuing need for shallow trench isolation methodology wherein the resulting gate oxide layer at the trench edges exhibits high reliability without unwanted electrical effects.

SUMMARY OF THE INVENTION

An object of the present invention is a method of manufacturing a semiconductor device having a shallow trench isolation region and a gate oxide with high reliability.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; providing a first mask on the pad oxide layer, the first mask containing a pattern having an opening with a dimension substantially equal to a dimension of the trench; etching to remove portions of the underlying pad oxide layer and to form the trench having an internal surface and edges at the main surface; removing the first mask; forming an oxide liner on the internal surface and edges of the trench; depositing a polish stop layer on the oxide liner and the pad oxide layer; providing a second mask on the polish stop layer, the second mask containing a pattern having an opening with a dimension substantially equal to a dimension of the trench; and isotropically etching to remove portions of the polish stop layer such that the oxide liner is exposed.

Another aspect of the present invention is a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; providing a first mask on the pad oxide layer, the first mask containing a pattern having an opening with a dimension substantially equal to a dimension of the trench; etching to remove portions of the underlying pad oxide layer and to form the trench having an internal surface and edges at the main surface; removing the first mask; forming an oxide liner on the internal surface and edges of the trench; depositing a polish stop layer on the oxide liner and the pad oxide layer; providing a second mask on the polish stop layer, the second mask containing a pattern having an opening with a dimension greater than a dimension of the trench; isotropically etching to remove portions of the polish stop layer such that the oxide liner is exposed; removing the second mask; depositing an insulating material to fill the trench and cover the polish stop layer; and planarizing the insulating material such that the polish stop is exposed.

Still another aspect of the invention is a semiconductor device comprising: a trench formed in a main surface of a semiconductor substrate or in an epitaxial layer formed on the substrate, the trench having edges at the main surface; a thermally grown oxide liner on a surface layer of the trench, the oxide liner being rounded at the trench edges; and an insulating material filling the trench and overlying the trench edges.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention constitutes an improvement over the methodology disclosed in copending application Ser. No. 08/993,858, achieving the advantages disclosed therein while avoiding undesirable electrical effects resulting from the polish stop remaining in the trench upon completion of the STI structure. In another embodiment, the present invention comprises a methodology enabling production of an even thicker oxide layer on the trench edges, thereby further improving gate oxide quality. Sharp trench edges and a gate oxide layer which is thinned at the trench edges limit the reliability of the finished semiconductor device. The present invention enables the manufacture of a semiconductor device without these undesirable features at the substrate/trench interface.

According to the methodology of an embodiment of the present invention, a photoresist mask is formed directly on a pad oxide layer which, in turn, is formed on a main surface of a semiconductor substrate or an epitaxial layer on a semiconductor substrate. As used thoughout the present disclosure and claims, the term "substrate" denotes a semiconductor substrate or an epitaxial layer formed on the semiconductor substrate.

After masking, the substrate is etched to form a trench, an oxide liner is grown in the trench surface, and a polish stop layer is deposited over the oxide liner and the pad oxide layer. The polish stop layer is then masked to the trench edges, and the polish stop in the trench etched away, leaving the polish stop on the pad oxide layer. The trench is then filled with an insulating material, the insulating material is planarized, as by CMP, and the polish stop is removed by anisotropic etching. Thus, the oxide liner is allowed to grow on the trench edges without the restraint of a polish stop, resulting in a thick, rounded oxide on the trench edges. In addition, the inventive methodology leaves no polish stop layer in the trench to cause unwanted electrical effects.

In another embodiment of the invention, the polish stop layer is not masked to the trench edge, but short of the trench edge. Thus, when the trench is filled with the insulating material, the insulating material will also be deposited over the trench edges. After the insulating material is planarized and the polish stop removed, a very thick oxide will remain over the trench edges, thereby allowing the subsequent growth of a high-quality gate oxide layer.

Figure 1:
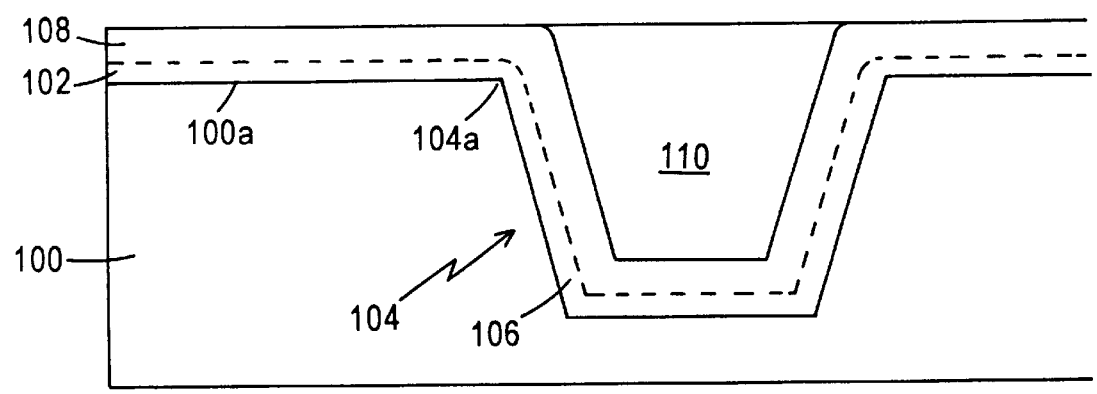
FIG. 1 is a cross-sectional view of an STI structure produced in accordance with the methodology disclosed in copending application Ser. No. 08/993,858.
Figure 2A:
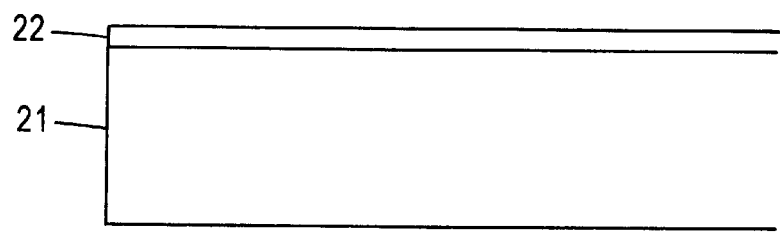
FIGS. 2A–2K schematically illustrate sequential phases of a method in accordance with a first embodiment of the present invention.

An embodiment of the present invention is illustrated in FIGS. 2A–2K, wherein sequential phases in forming a semiconductor device in accordance with the present invention are depicted. Referring to FIG. 2A, substrate 21 is prepared having a substantially planar surface, typically a semiconductor substrate comprising doped monocrystalline silicon or an epitaxial layer formed on a semiconductor substrate in accordance with conventional practices. A pad oxide layer 22 is then grown on the substrate 21. Pad oxide layer 22 is typically silicon oxide and can be thermally grown on the substrate or deposited by chemical vapor deposition (CVD) to a thickness of about 100 Å to about 200Å. In another embodiment, a pad oxide containing a thinned thermally-grown silicon oxide layer and a buffer polycrystalline silicon layer is employed as the pad layer. FIG. 2A illustrates silicon substrate 21 and the pad oxide layer 22.

Figure 2B:
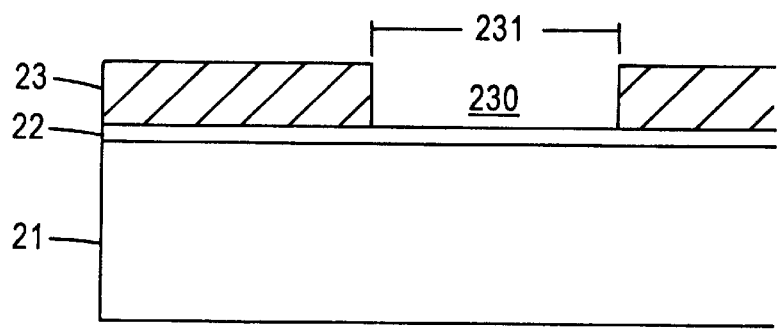
Figure 2C:
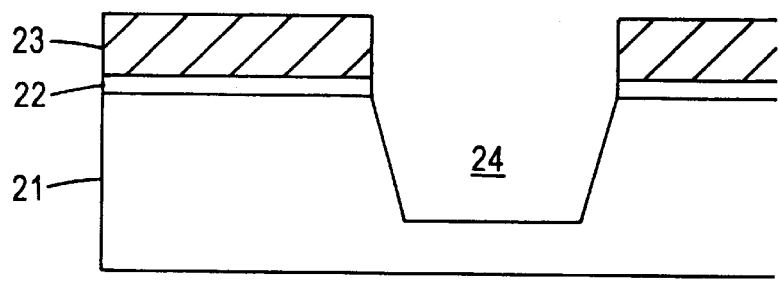

A photoresist mask 23 is then formed on pad oxide layer 22, as shown in FIG. 2B. Photoresist mask 23 has a pattern defined by openings 230, which have a width 231 substantially corresponding to the width of the subsequently formed trench, typically about 0.25μ or less. The pad oxide layer 22 is then etched away, and the etching continues into the substrate 21 to form the shallow trench 24, as shown in FIG. 2C. The trench 24 is typically etched to a depth of about 2500 Å to about 4000 Å; e.g., about 3000 Å.

Figure 2D:
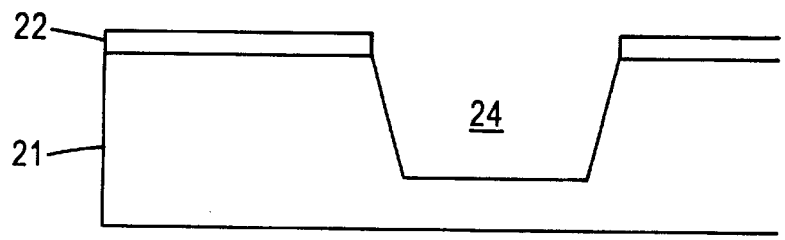
Figure 2E:
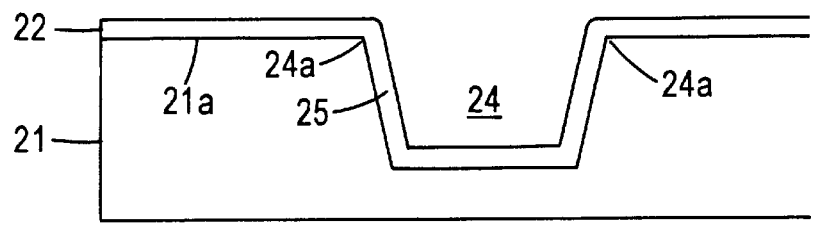

When the etching of the trench 24 is completed, the photoresist 23 is stripped off the pad oxide layer 22, resulting in the trench shown in FIG. 2D. Thereafter, the trench surface is thermally oxidized to form an oxide liner 25 on the inner surface of trench 24 and at the trench edges 24a, typically at a temperature of about 1000° C. During growth of the oxide liner 25, oxide will also grow on the main surface 21a of the substrate 21, thereby increasing the thickness of the pad oxide 22. FIG. 2E shows the trench 24 with the completed liner 25.

Figure 2F:
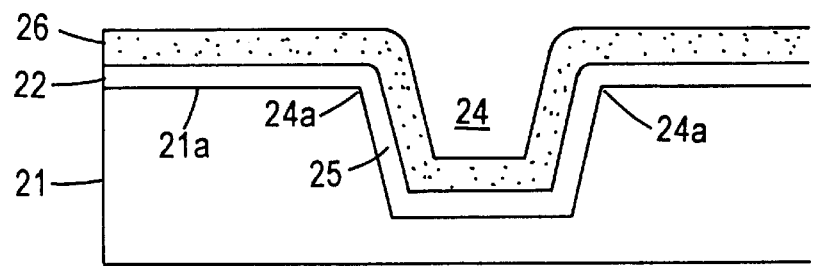
Figure 2G:
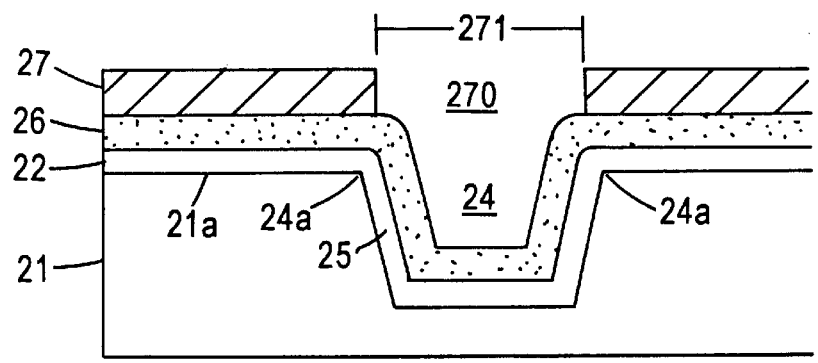
Figure 2H:
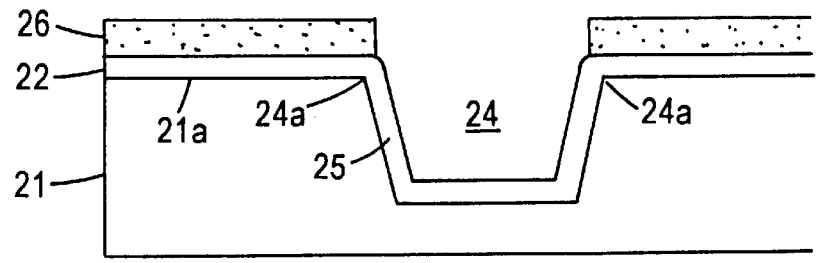

Adverting to FIG. 2F, a polish stop layer 26 is deposited over the oxide liner 25 and pad oxide layer 22. A photoresist mask 27 is then formed on polish stop layer 26, as shown in FIG. 2G. Photoresist mask 27 has a pattern defined by openings 270, which have a width 271 substantially corresponding to the width of the trench 24. The exposed portions of the polish stop layer 26 are then etched away by isotropic etching. The polish stop layer 26 is typically silicon nitride, although any material may be employed that polishes more slowly than the subsequently applied insulating material and etches selective to the liner oxide 25 and pad oxide layer 22 (to avoid damage to oxide liner 25 and pad oxide 22 by the etchant). FIG. 2H depicts the trench 24 after the polish stop 26 has been etched, and the photoresist mask 27 removed.

Figure 2I:
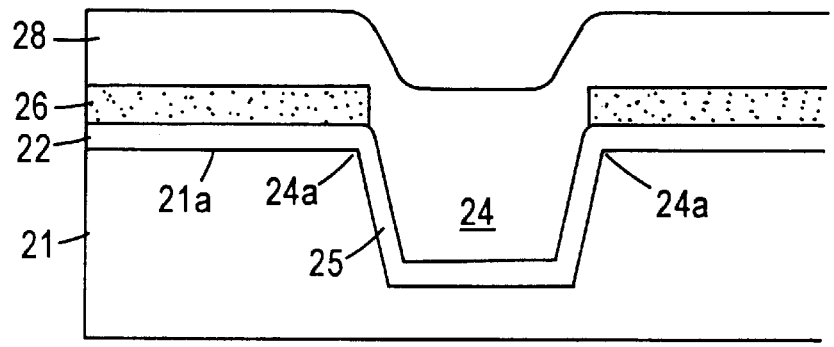
Figure 2J:
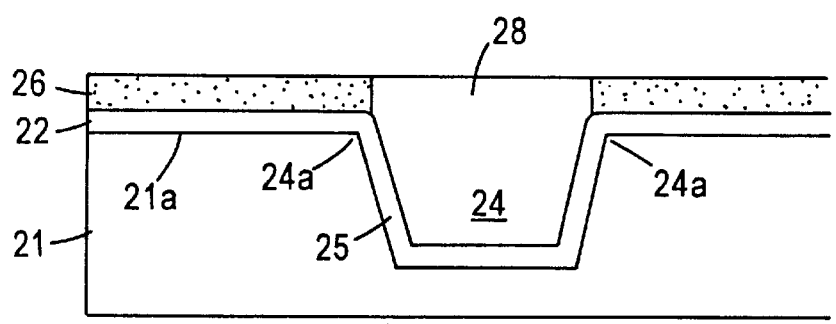
Figure 2K:
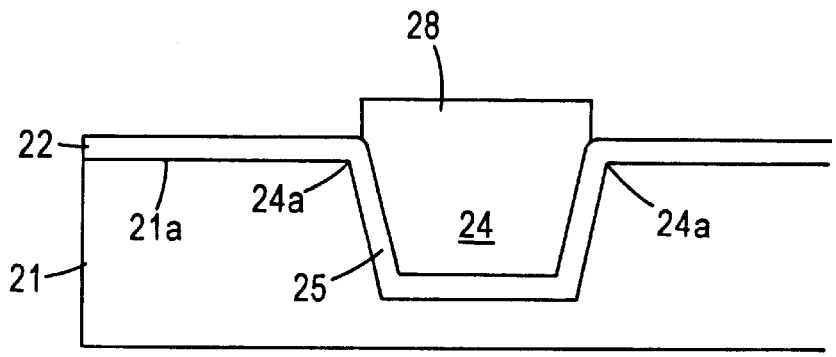

Subsequent to etching of the polish stop layer, trench 24 is filled with a suitable insulating material 28, as shown in FIG. 2I. Such insulating material can comprise silicon dioxide derived from TEOS by LPCVD or derived from silane by LPCVD. The trench 24 can also be filled with a high density plasma (HDP) oxide, preferably employing the methodology disclosed in copending application Ser. No. 08/924,133, filed Sep. 5, 1997, the entire disclosure of which is hereby incorporated herein by reference. Subsequent to trench filling, planarization is effected, such as by CMP, as shown in FIG. 2J, by polishing the insulating material 28. After CMP is stopped, the polish stop layer 26 is removed, preferably by etching with high selectivity to pad oxide layer 22, liner oxide 25 and insulating material 28, to preserve the insulating material 28 proximal to the trench edges 24a and yield the structure illustrated in FIG. 2K.

The foregoing embodiment of the present invention achieves advantages substantially the same as those achieved by the STI formation technique disclosed in copending application Ser. No. 08/993,858. However, because the polish stop layer 26 is removed from the trench 24 before the insulating material 28 is deposited, the unwanted electrical effects caused by the presence of polish stop in the trench are avoided.

Figure 3A:
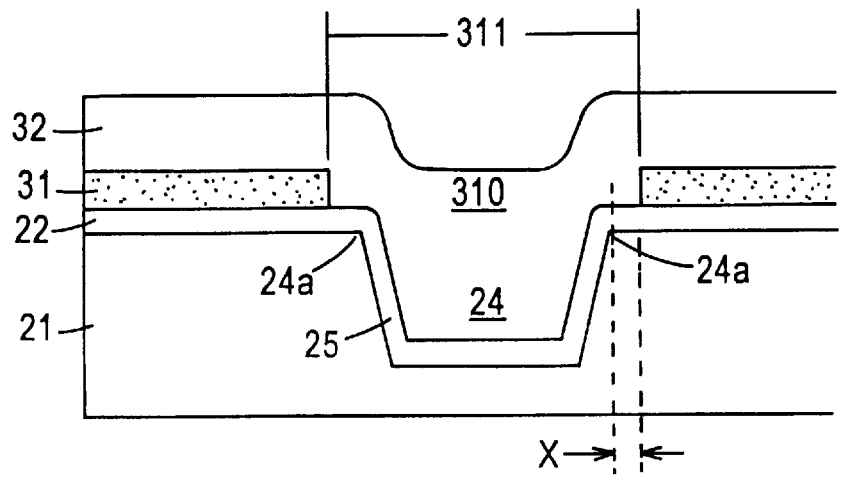
FIGS. 3A–3C schematically illustrate sequential phases of a method in accordance with a second embodiment of the present invention.
Figure 3B:
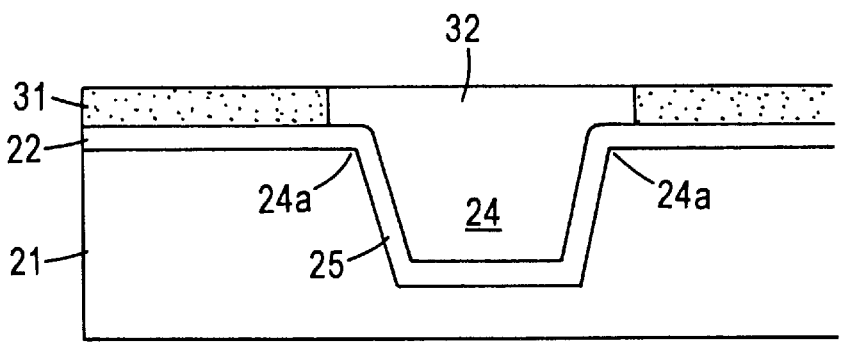
Figure 3C:
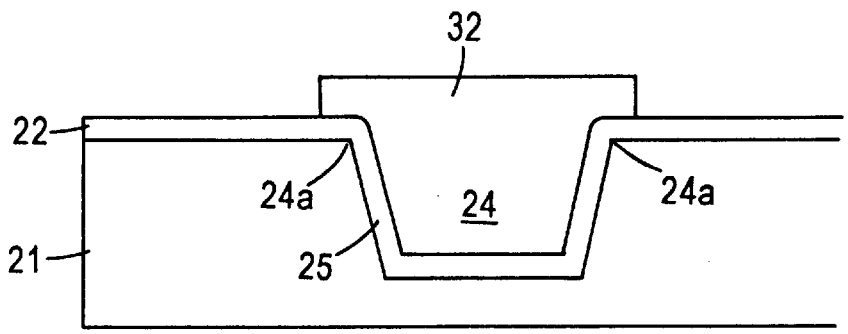

FIGS. 3A–3C depict sequential phases in forming a semiconductor device in accordance with a second embodiment of the present invention. Referring to FIG. 3A, in this embodiment, the trench 24 is formed, the oxide liner 25 grown and the polish stop layer 31 applied as in the first embodiment described above. However, the polish stop layer 31 is masked and etched using a photoresist mask (not shown) containing an opening larger than the width of the trench 24, to produce opening 310 in the polish stop layer 31 having a corresponding width 311. One having ordinary skill in the art can easily optimize the width 311 of the polish stop layer to achieve the objectives of the present invention. For example, it was found that a photoresist mask having a width of about 50 nm greater than the trench opening is suitable.

Accordingly, the distance x in FIG. 3A between the trench edge and the polish stop 31 can suitably be about 50 nm. Thus, the trench edges 24a are exposed after etching of the polish stop layer 31, and when the insulating material 32 is applied as in the first embodiment, it covers the trench edges 24a. After filling the trench 24, the insulating material 32 is planarized, as by CMP (FIG. 3B) and the polish stop 31 is subsequently removed by anisotropic etching to yield the structure shown in FIG. 3C, which has a very thick oxide remaining over the trench edges 24a.

This embodiment of the present invention achieves advantages substantially the same as those achieved by the first embodiment of the invention. It also achieves the additional advantage of providing a thick oxide layer over the trench edges 24a, thereby facilitating the subsequent growth of a high-quality gate oxide layer.

Figure 4:
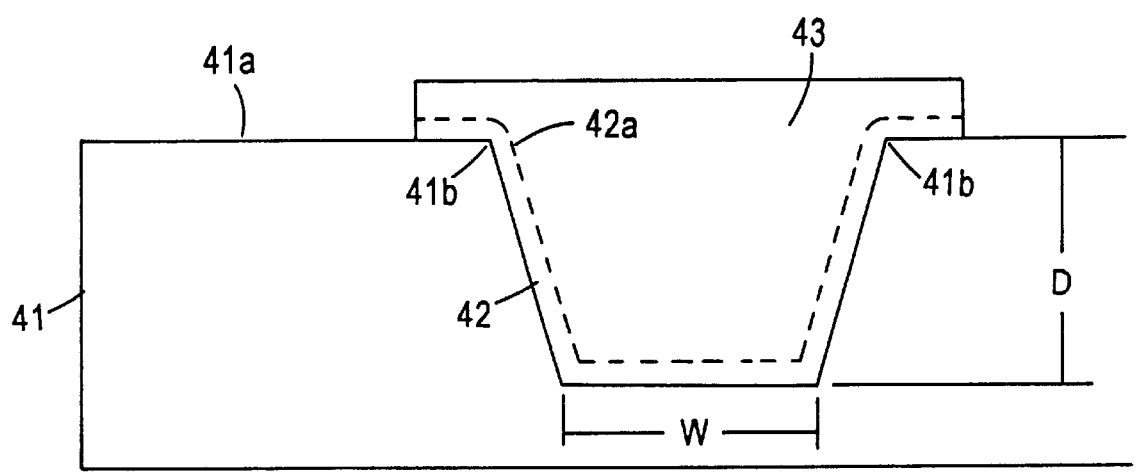
FIG. 4 is a cross-sectional view of a semiconductor device according to the present invention.

An embodiment of a semiconductor device produced according to the present invention produced by the method of the second embodiment of the invention is described with reference to FIG. 4. The inventive semiconductor device comprises a trench formed in a main surface 41a of a substrate 41 or in an epitaxial layer formed in substrate 41. The trench has edges 41b at the main surface 41a. A silicon dioxide liner 42 is thermally grown on a surface layer of the trench, and a silicon dioxide insulating material 43 fills the trench and overlies the trench edges 41b. The trench has a width W of about $0.25\mu$ or less, and a depth D of about 2500 Å to about 4000Å, and in a preferred embodiment has a depth D of about 3000 Å.

The trench isolation formed in accordance with the present invention is characterized by gate oxide layers at the trench edges which are not thinned, but exhibit high quality with an attendant reduction in the electric field between the gate electrode and the substrate at the trench edges. The present invention is applicable to the manufacture of various types of semiconductor devices having STI, particularly high density semiconductor devices having a design rule of about $0.25\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an insulated trench formed in a semiconductor substrate or in an epitaxial layer on the semiconductor substrate, which method comprises:

forming a pad oxide layer on a main surface of the substrate or epitaxial layer;

providing a first mask on the pad oxide layer, the first mask containing a pattern having an opening with a dimension substantially equal to a dimension of the trench;

etching to remove portions of the underlying pad oxide layer and to form the trench having an internal surface and edges at the main surface;

removing the first mask;

forming an oxide liner on the internal surface and edges of the trench;

depositing a polish stop layer on the oxide liner and the pad oxide layer;

providing second mask on the polish stop layer, the second mask containing a pattern having an opening with a dimension substantially equal to a dimension of the trench; and isotropically etching to remove portions of the polish stop layer such that the oxide liner is exposed.

2. The method according to claim 1, wherein the pad oxide layer comprises silicon oxide.

3. The method according to claim 1, wherein the first and second masks comprise photoresist masks.

4. The method according to claim 1, wherein the openings in the first and second masks have a width substantially equal to a width of the trench.

5. The method according to claim 4, wherein the width of the opening is about 0.25µ or under.

6. The method according to claim 5, wherein the trench is etched to a depth of about 2500 Å to about 4000 Å.

7. The method according to claim 6, wherein the trench is etched to a depth of about 3000 Å.

8. The method according to claim 2, comprising heating at a temperature of about 1000° C. to thermally grow a silicon oxide liner.

9. The method according to claim 8, wherein the silicon oxide liner is formed on the trench edges with a rounded configuration.

10. The method according to claim 1, further comprising filling the trench with insulating material after etching the polish stop layer.

11. The method according to claim 10, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

12. The method according to claim 11, comprising planarizing the insulating material such that the polish stop is exposed.

13. The method according to claim 12, comprising planarizing by chemical-mechanical polishing.

14. The method according to claim 12, comprising etching the polish stop with high selectivity to the pad oxide and insulating material after planarizing.

15. The method according to claim 1, wherein the polish stop layer comprises silicon nitride.

16. A method of manufacturing a semiconductor device having an insulated trench formed in a semiconductor substrate or in an epitaxial layer on the semiconductor substrate, which method comprises:

forming a pad oxide layer on a main surface of the substrate or epitaxial layer;

providing a first mask on the pad oxide layer, the first mask containing a pattern having an opening with a dimension substantially equal to a dimension of the trench;

etching to remove portions of the underlying pad oxide layer and to form the trench having an internal surface and edges at the main surface;

removing the first mask;

forming an oxide liner on the internal surface and edges of the trench;

depositing a polish stop layer on the oxide liner and the pad oxide layer;

providing a second mask on the polish stop layer, the second mask containing a pattern having an opening with a dimension greater than a dimension of the trench;

isotropically etching to remove portions of the polish stop layer such that the oxide liner is exposed;

removing the second mask;

depositing an insulating material to fill the trench and cover the polish stop layer; and planarizing the insulating material such that the polish stop is exposed.

17. The method according to claim 16, wherein the pad oxide layer comprises silicon oxide.

18. The method according to claim 16, wherein the first and second masks comprise photoresist masks.

19. The method according to claim 16, wherein the opening in the first mask has a width substantially equal to a width of the trench, and the opening in the second mask has a width greater than the width of the trench.

20. The method according to claim 19, wherein the width of the opening in the first mask is about 0.25µ or under.

21. The method according to claim 20, wherein the trench is etched to a depth of about 2500 Å to about 4000Å.

22. The method according to claim 21, wherein the trench is etched to a depth of about 3000 Å.

23. The method according to claim 17, comprising heating at a temperature of about 1000° C. to thermally grow a silicon oxide liner.

24. The method according to claim 23, wherein the silicon oxide liner is formed on the trench edges with a rounded configuration.

25. The method according to claim 16, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

26. The method according to claim 25, comprising polishing by chemical-mechanical polishing.

27. The method according to claim 16, wherein the polish stop layer comprises silicon nitride.

28. The method according to claim 16, comprising etching the polish stop layer with high selectivity to the pad oxide and the insulating material after the planarizing step.

29. The method according to claim 16 wherein, after planarizing, the insulating material at the trench edges has a thickness greater than the thickness of the pad oxide layer.

30. A method of manufacturing an integrated circuit on a semiconductor substrate, which method comprises:

forming a silicon oxide pad layer on a main surface of the substrate or an epitaxial layer formed on the substrate;

providing a first photoresist mask on the silicon oxide pad layer, the first mask containing a pattern having an opening with a width substantially equal to a width of the trench of about 0.25µ or less;

etching to remove portions of the underlying silicon oxide pad layer and to form the trench, at a depth of about 2500 Å to about 4000Å, the trench having an internal surface and edges at the main surface;

removing the first mask;

thermally growing a thin silicon oxide liner on the internal surface and edges of the trench by heating to a temperature of about 1000° C., whereby the silicon oxide liner grown on the trench edges is rounded;

depositing a silicon nitride polish stop layer on the silicon oxide liner and the silicon oxide pad layer;

providing a second mask on the silicon nitride polish stop layer, the second mask containing a pattern having an opening with a dimension greater than the width of the trench;

isotropically etching to remove portions of the silicon nitride polish stop layer such that the silicon oxide liner is exposed;

removing the second mask;

depositing an insulating material to fill the trench and cover the silicon nitride polish stop layer, the insulating material comprising silicon dioxide derived from tetraethyl orthosilicate (TEOS) by low pressure chemical vapor deposition (LPCVD), silicon dioxide derived from silane by LPCVD, or a high density plasma oxide;

chemical-mechanical polishing the insulating material such that the silicon nitride polish stop layer is exposed, whereby the insulating material at the trench edges has a thickness greater than the thickness of the silicon oxide pad layer.

* * * * *